United States Patent [19]
Chaffee

[11] 3,962,630
[45] June 8, 1976

[54] ELECTRICAL CONTINUITY AND VOLTAGE TESTING DEVICE
[75] Inventor: Bertram Chaffee, Anaheim, Calif.
[73] Assignee: Mono-Probe Corporation, Los Angeles, Calif.
[22] Filed: Oct. 31, 1974
[21] Appl. No.: 519,747

[52] U.S. Cl. .............................. 324/51; 324/56; 324/133; 324/149
[51] Int. Cl.² ........................................ G01R 31/02
[58] Field of Search .................. 324/51, 62, 53, 96, 324/133, 149

[56] References Cited
UNITED STATES PATENTS
3,416,074  12/1968  Shoonover .......................... 324/51
3,612,999  10/1971  Bergerlo et al. ..................... 324/149
FOREIGN PATENTS OR APPLICATIONS
2,213,583  12/1972  Germany ............................. 324/56
1,192,563  5/1970  United Kingdom ................. 324/149

Primary Examiner—James B. Mullins
Attorney, Agent, or Firm—William W. Haefliger

[57] ABSTRACT

A circuit testing device comprises
a. multiple probes at least one of which is sized for insertion into a single electrical socket receptacle to test for the presence of voltage, and two of which are applicable to spaced conductive elements to test for electrical continuity therebetween externally of said device,
b. detection means operatively connected with said probes and including indicator means to indicate the presence or absence of voltage when said one probe is inserted into said socket single receptacle, and to indicate the presence or absence of electrical continuity when said two probes are applied to said spaced conductive elements.

6 Claims, 8 Drawing Figures

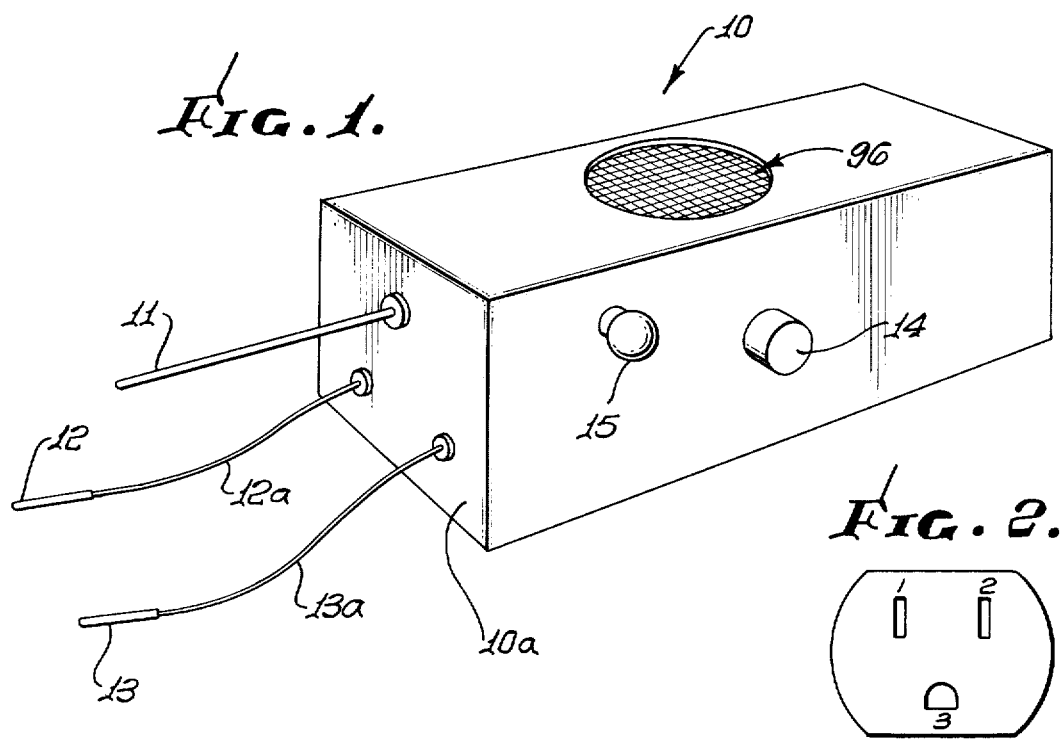
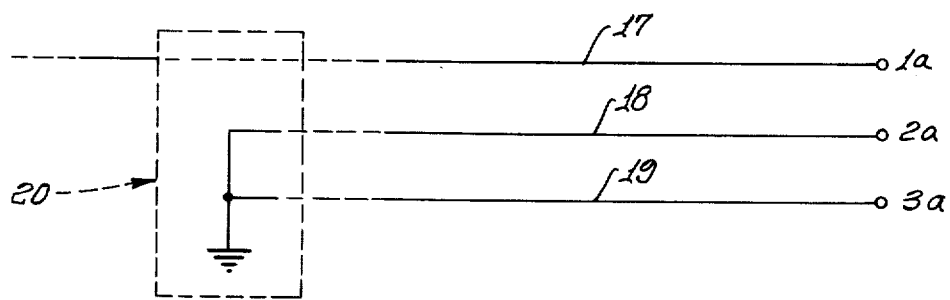
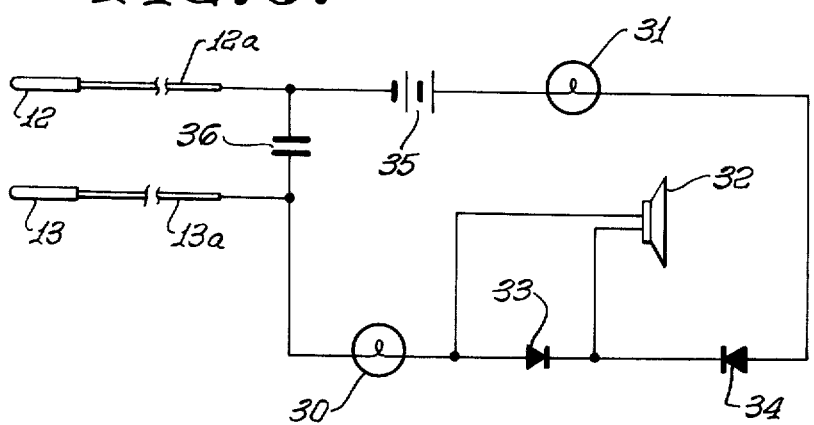

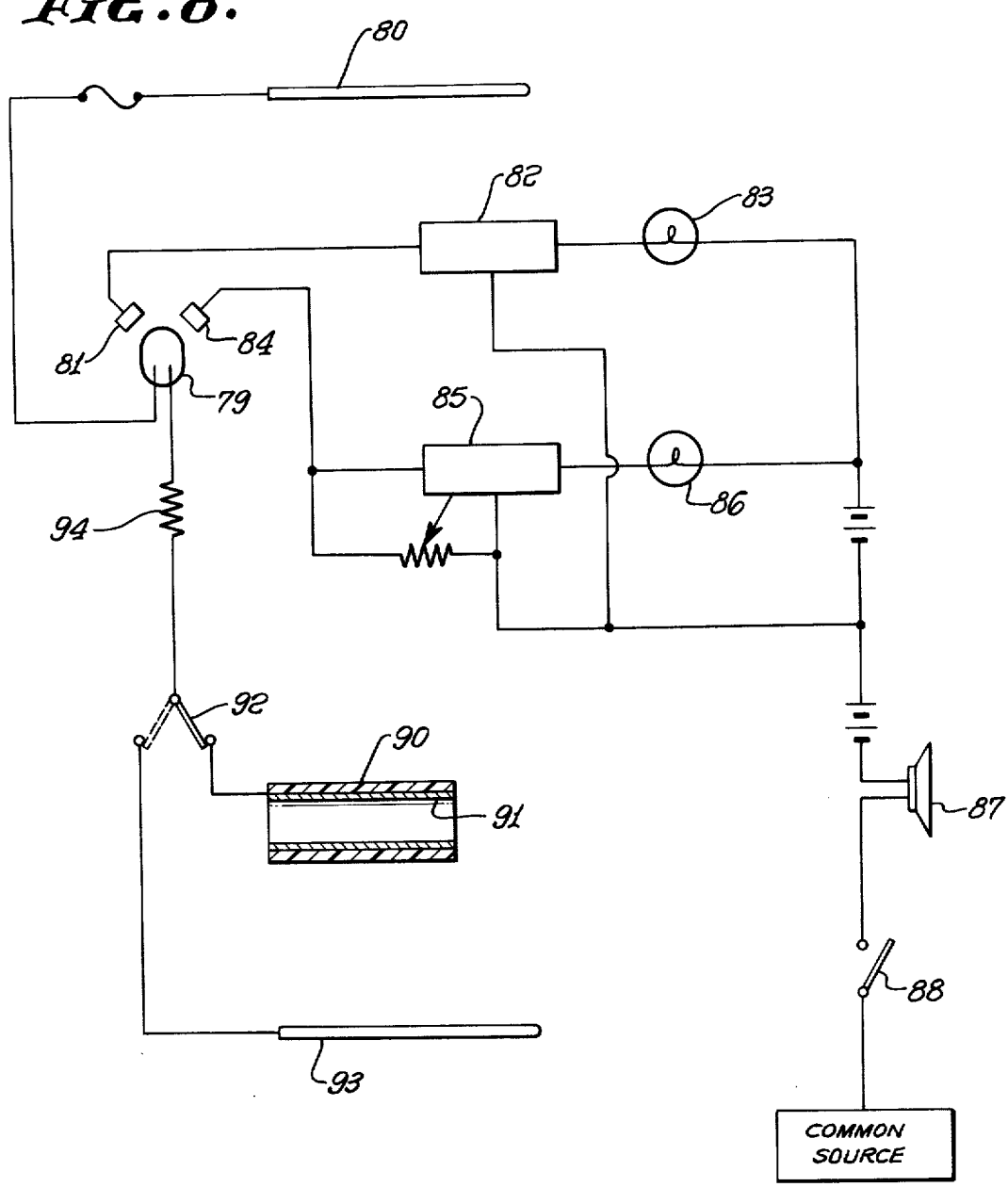

ELECTRICAL CONTINUITY AND VOLTAGE TESTING DEVICE

BACKGROUND OF THE INVENTION

This invention relates generally to circuit testing devices, and more particularly concerns apparatus to test for voltages and electrical continuity. The invention enables the use of two tester probes to change from continuity testing to voltage testing, no switching devices being required and with the further advantage that no damage or injury can occur to the device or the user. In addition, the presence of 110 and 220 volts can be determined using a single probe, with sound or light indicators being activated, the use of a neutral or ground not being required. A sound indicator is usable to indicate continuity.

Electrical contractors and electricians must frequently determine whether or not voltage is present at a terminal, lead or line, as for example 110, 220 to 440 volts. If the outlet or terminal being tested is difficult to reach, the running of a separate ground line to accomplish the test becomes very difficult. Such workmen also frequently need to know if there is electrical continuity between two terminals; for example, if such continuity is lacking as between neutral and ground terminals at a receptacle, there is the possibility of a break in the neutral wire. Prior devices for resolving these questions have lacked the many unusual advantages in construction, mode of operation and results as are provided by the present invention.

SUMMARY OF THE INVENTION

It is a major object of the invention to provide simple testing apparatus overcoming the problems associated with prior devices and providing the advantages referred to. Basically, the device comprises:

a. multiple probes at least one of which is sized for insertion into a single electrical socket receptacle to test for the presence of voltage, and two of which are applicable to spaced conductive elements to test for electrical continuity therebetween externally of said device, b. detection means operatively connected with said probes and including indicator means to indicate the presence or absence of voltage when said one probe is inserted into said socket single receptacle, and to indicate the presence or absence of electrical continuity when said two probes are applied to said spaced conductive elements.

As will appear, one probe may be rigidly carried by a hand-held housing for voltage testing, and two additional probes may be used for continuity checking; voltage testing may be accomplished without danger or shock to the user; both sound and light indicators may be employed; and the same detection circuit elements may be employed for both voltage and continuity check out.

These and other objects and advantages of the invention, as well as the details of an illustrative embodiments, will be more fully understood from the following description and drawings, in which:

DRAWING DESCRIPTION

FIG. 1 is a perspective drawing of a testing device embodying the invention;

FIG. 2 is a representation of a plug-in receptacle;

FIG. 3 is a representative of three wire levels connected to the FIG. 2 terminals; and FIGS. 4–8 are circuit diagrams.

DETAILED DESCRIPTION

Figure 4:
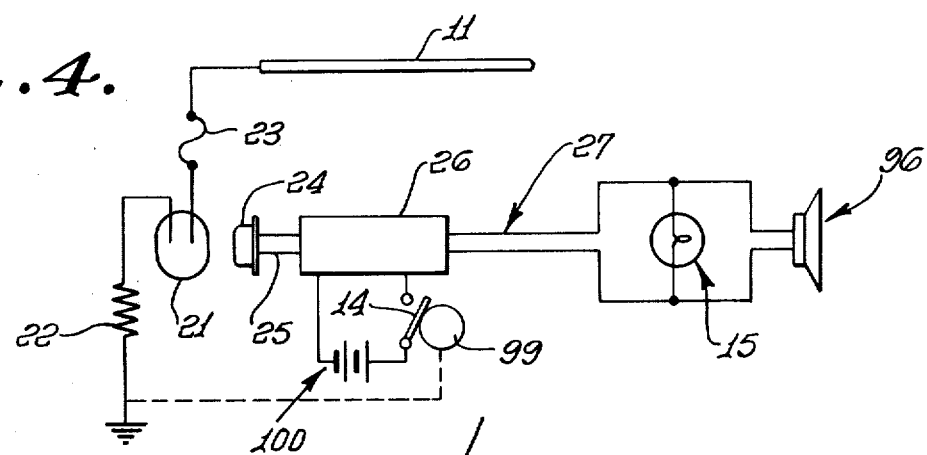

Referring first to FIG. 1, the portable, insulative housing 10 is elongated, to be hand-carried. Probes 11, 12 and 13 project from the housing end wall 10a, the first being relatively rigid, and the second and third may be carried by flexible cables 12a and 13a. The housing also carries a push-button switch 14, a light 15, and a buzzer or speaker 96.

Extending the description to FIG. 2, the rigid probe 11 may be inserted into any of the openings 1, 2 and 3 of the electrical plug-in type receptacle 16, by urging the housing toward the front of the receptacle. With the push-button 14 depressed, the light 15 and buzzer 96 will respond to indicate the presence of voltage, as for example 110 or 220 volts. Merely as illustrative, FIG. 3 shows opening 1 containing a terminal 1a connected with the "hot" line 17, and openings 2a and 3a connected with lines 18 and 19 connected to ground at a remote panel 20, for example.

FIG. 4 shows the probe 11 connected in series with a neon lamp or bulb 21 and a high resistance (1 megohm for example) resistor 22, the latter also connected to ground such as a chassis point in the housing 10, or to a metal ring 99 positioned at the switch 14 to be depressed by the operator, so that the user's thumb contacts the ring. A fuse 23 is also employed, as shown. Thus, the worker is not endangered during use of the device.

When the probe is applied to a 110 or 220 volt source, light transmitted from lamp 21 is picked up by photocell 24, and transmitted at 25 to amplifier 26. The latter is energized by closing of switch 14 in a battery circuit 100. The amplifier output at 27 operates the signal light 15 and buzzer or speaker 96. The intensities of the outputs of the elements 15 and 96 are controlled by the voltage applied to the probe, for visual discrimination by the operator. Accordingly, he may test any line or terminal for the presence of positive voltage. Further, if two wires are exposed, one hot and the other neutral, the user may quickly determine which is which.

Circuit continuity testing may also be carried out using probes 12 and 13. This can be important from a consideration of FIGS. 2 and 3. Terminals 2a and 3a are there shown as connected via lines 18 and 19 with a ground at a remote panel 20. If line 18 contains a break, then a circuit will not be established when a plug is inserted into openings 1 and 2 in FIG. 2. To test for the possible presence of such a break, the probes 12 and 13 are inserted into openings 2 and 3 to engage terminals 2a and 3a, and push-button 14 is depressed. If the light 15 comes on, and the buzzer 96 sounds, there is continuity and no break in line 18; but if the light and buzzer do not respond, there is the likelihood of such a break.

Referring to FIG. 5, the detection circuitry associated with probes 12 and 13 includes light indicators 30 and 31, speaker 32, 6 volt Zener diode 33, diode 34, and battery 35. When the probes are applied to a continuous circuit, the speaker emits sound; when the probes are applied to a source of 110 AC voltage, the speaker emits sound and the lights dimly glow; and when the probe are applied to a source of 220 AC voltage, the sound is much greater and the lights glow brightly. Capacitor 36 shunts, substantially, the AC current.

Figure 6:
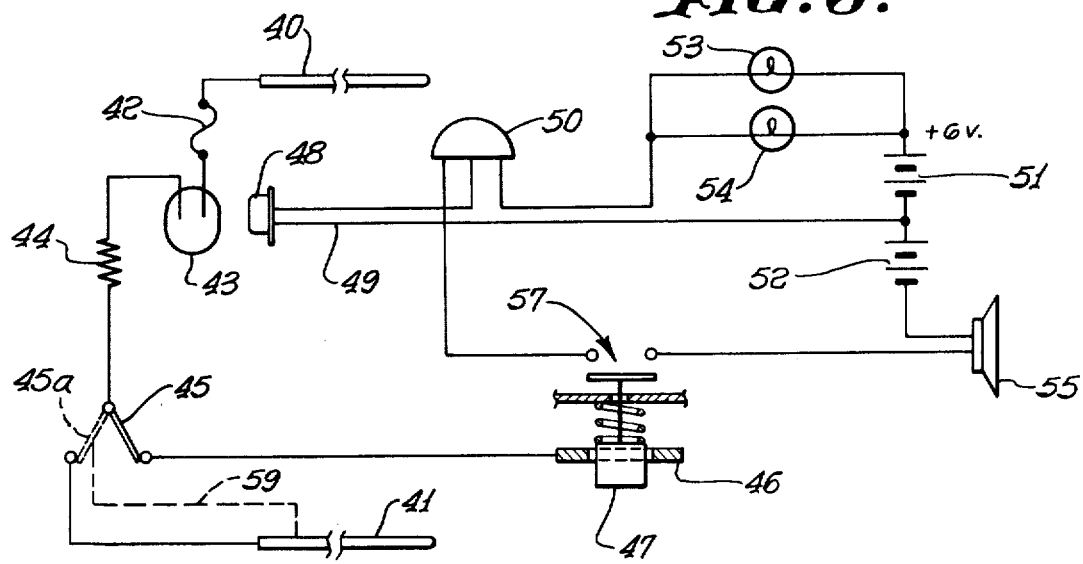

Referring to the composite circuit of FIG. 6, two probes 40 and 41 are used, rather than one, as in FIG. 4. The circuit that includes probe 40, fuse 42, neon lamp 43, resistor 44, switch 45 and grounding ring 46 adjacent push-button 47 corresponds to that of FIG. 4. In this regard, photo-electric cell 48 controls battery voltage application to base lead 49 of the transistor amplifier 50. Elements connected in the emitter-collector circuit of the transistor amplifier include batteries 51 and 52, parallel connected signal lamps 53 and 54, speaker 55 and switch 57 activated by push-button 47. In operation, when 110 VAC is detected by probe 40, light 53 may come on, and the speaker will sound; and when 220 VAC is detected, light 54 will also come on, and the speaker will sound at a higher intensity level.

The same circuitry is employed for voltage testing, employing both probes 40 and 41. Switch 45 is then moved to alternate position 45a, by hand or automatically as a result of manipulation of probe 41, a switch operating mechanical connection being indicated at 59.

Neon lamp 43 then glows with intensity proportional to voltage application across probes 40 and 41. The voltage at the transistor base is then proportionately controlled to control the battery current operating the lights 53 and 54, and the speaker 55.

Figure 7:
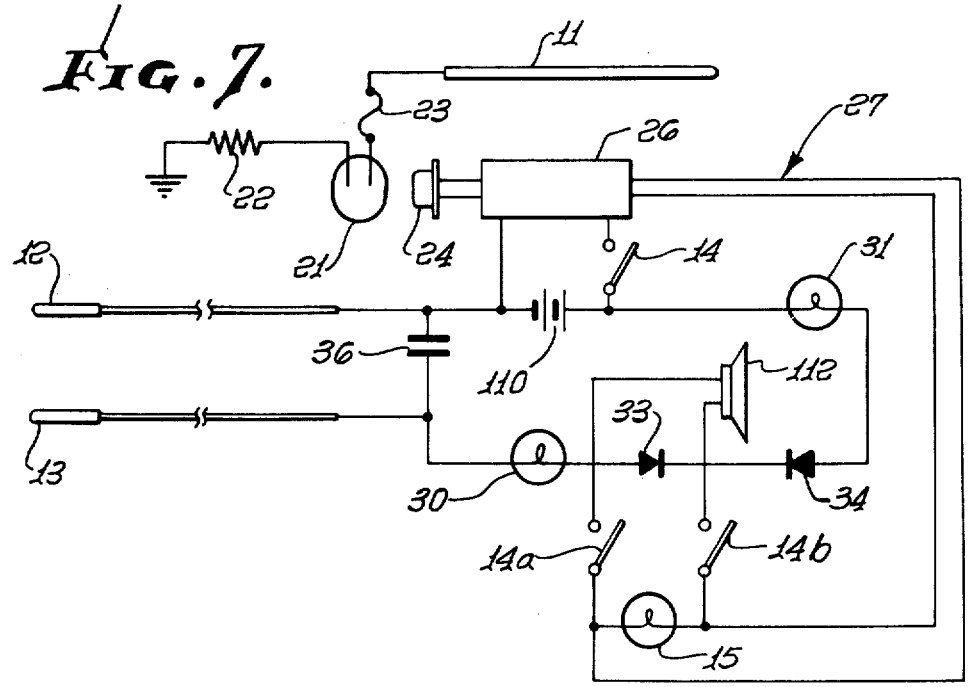

FIG. 7 also shows the manner in which circuitry of FIGS. 4 and 5 may be combined so as to utilize the same speaker (current to sound transducer) and battery elements. Thus, a single battery 110 is used rather than the two batteries 100 and 35 of FIGS. 4 and 5; also, a single speaker 112 is used rather than speakers 96 and 32.

Ganged switches 14, 14a and 14b are closed when voltage testing probe is used for voltage testing. Such switches connect battery 110 with amplifier 26, and the output leads 27 with speaker 112, as shown.

From what has been described, the device may be said to embody:

a. multiple probes at least one of which is sized for insertion into a single electrical socket receptacle to test for the presence of voltage, and two of which are applicable to spaced conductive elements to test for electrical continuity therebetween externally of said device, b. detection means operatively connected with said probes and including indicator means to indicate the presence or absence of voltage when said one probe is inserted into said socket single receptacle, and to indicate the presence or absence of electrical continuity when said two probes are applied to said spaced conductive elements.

In this regard, the FIG. 1 housing 10 contains the detection means; and in FIGS. 1, 4, 5 and 7, the one probe (probe 11) is separate and apart from the two probes (probes 12 and 13).

In using the device of FIG. 6, for example, a single probe 40 may be used to detect voltage of 110 and 220 volts, eliminating need for separate a ground or neutral test lead. Thus, light 53 comes on for 110 volts, and light 54 comes on for 220 volts (the speaker or buzzer sounds at two different levels, for these voltages). Testing for 440 volts is accomplished by detecting 22 volts on each bus bar or both sides of a receptacle. Both AC and DC may be tested in this way. A test for a broken "neutral" wire may be made as described above.

On a non-grounded fuse block, it is simple to determine with the single probe which is the load wire, and which is the neutral. Fuse testing is made extremely simple by touching the probe to line side of fuse and the load side of fuse. When testing a fuse block or circuit breakers, it is only necessary to touch load size of fuse or breaker when the line size is connected to a bus bar. It is not necessary to look at the tester to determine a voltage indication, as the sound indication will indicate voltage.

Further, when installing a three wire service and one is ready to hook up temporarily to the two wire service, one must determine which is the hot wire coming from the pole. The device will determine the hot line. To determine which of the three wires coming from the new service stack is the neutral, one merely uses the continuity probes, touching the stack (ground) with probe 12 and with the other probe 13 checking each new lead until a sound is heard which indicates that particular wire is the neutral, since it is forming a complete circuit from the neutral bus bar around to the grounded stack. Where one is working in broad daylight, it is a great convenience not to have to look for a light indication, knowing that the sound indicator indicates that voltage or continuity is present.

Other applications include establishing neutrals; ground; motors; controls; relays, primary and secondary sides of transformers for voltages and continuity; continuity phasing pairs in motors for 110, 220 and 440 volts; switchboard tests for low and high voltage; relays, low and high voltage; telephones, testing systems via sound and single probe; testing single phase and three phase windings of motors.

The device is usable when no ground is available, and an outlet terminal (which may be quite inaccessible as in an attic, under a floor, etc.) is not operative. The single probe can then be applied to the terminal or wire to determine if it is hot.

The FIG. 7 device is similar to that of FIG. 6, but varies in that two sensors and two amplifiers are used. Thus, relatively low voltage (say 115 VAC) applied to probe 80 activates sensor 81 (via near tube 79) and the output of the sensor is amplified at 82 to cause light indicator 83 to glow; and relatively higher voltage (say 220 VAC) applied to probe 80 activates sensor 84 the output of which is amplified at 85 to cause light indicator 86 to glow (in addition to glow of sensor 83). Either voltage will cause the sound transducer such as speaker 87 to operate. A turn-on switch is seen at 88.

Isolation of the user's body is achieved by providing an electrically insulative layer 90 over the outer surface of the cylindrical metallic housing 91 which contains the described circuitry. Switch 92 is movable between the voltage reading position shown in full lines, in which it is in electrical series with the housing 91, resistor 94 and tube 79, and the alternate position 92a, in which it is connected with the second probe 93.

I claim:

1. In a circuit testing device, a. two probes one of which is sized for insertion into a single electrical socket receptacle to test for the presence of voltage, and both of which are applicable to spaced conductive elements to test for electrical continuity therebetween externally of said device, there being means connecting said probes in series for said continuity test, b. detection means operatively connected with said probes and including indicator means to indicate the presence or absence of voltage when said one probe is inserted into said socket single receptacle, and to indicate the presence or absence of electrical continuity when said two probes are applied to said spaced conductive elements, there being a casing carrying said detection means and sized to be hand carried, said one probe projecting relatively rigidly from said casing, c. said detection means including a gas discharge lamp and electrical resistance, both connected in series between said one probe and the casing, d. said indicator means including photocell means located to be illuminated by radiation from the lamp, amplififer means connected with the photocell means, and indicator structure connected with the amplifier means output.

2. The device of claim 1 wherein said indicator structure comprises multiple luminous indicators connected with said amplifier means so that different indicators glow in correspondence to different radiation levels from said gas discharge lamp.

3. The device of claim 1 wherein said indicator means includes sound transducer means.

4. The device of claim 1 wherein said means connecting the probes in series comprises a switch connected in series with said resistance and operable to connect said second probe in series therewith.

5. The device of claim 1 wherein the detector means includes a finger operated push-button switch operable to connect a battery in energizing relation with said amplifier means.

6. The device of claim 1 wherein said casing has an insulative layer at the outer side thereof.

* * * * *